(12) United States Patent
Zaidi et al.

(10) Patent No.: US 7,030,506 B2
(45) Date of Patent: Apr. 18, 2006

(54) MASK AND METHOD FOR USING THE MASK IN LITHOGRAPHIC PROCESSING

(75) Inventors: Syed Shoaib Hasan Zaidi, Poughkeepsie, NY (US); Alois Gutmann, Dresden (DE); Gary Williams, Mechanicsville, VA (US)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/685,004

(22) Filed: Oct. 15, 2003

(65) Prior Publication Data

US 2005/0082559 A1    Apr. 21, 2005

(51) Int. Cl.
*H01L 23/544*    (2006.01)
(52) U.S. Cl. ............... 257/797; 257/283; 257/E23.179
(58) Field of Classification Search ............... 257/797, 257/283, E23.179
See application file for complete search history.

(56) References Cited

U.S. PATENT DOCUMENTS

| 5,141,322 | A | * | 8/1992 | Miyatake | 356/401 |
|---|---|---|---|---|---|
| 6,130,750 | A | | 10/2000 | Ausschnitt et al. | |
| 6,359,735 | B1 | | 3/2002 | Gombert et al. | |
| 6,417,922 | B1 | * | 7/2002 | Dirksen et al. | 356/401 |
| 6,628,392 | B1 | * | 9/2003 | Kuroda et al. | 356/400 |
| 6,778,275 | B1 | * | 8/2004 | Bowes | 356/400 |
| 2002/0080364 | A1 | | 6/2002 | Monshouwer et al. | |
| 2005/0041256 | A1 | * | 2/2005 | Kreuzer | 356/508 |

FOREIGN PATENT DOCUMENTS

| EP | 0 727 715 A1 | 8/1996 |
|---|---|---|
| EP | 1 162 507 A2 | 12/2001 |

\* cited by examiner

*Primary Examiner*—Tu-Tu Ho
(74) *Attorney, Agent, or Firm*—Edell, Shapiro, Finnan LLC

(57) ABSTRACT

A method and mask to improve measurement of alignment marks is disclosed. An exemplary embodiment of the invention includes a resist mask with a patterned alignment mark comprising an assemblage of features whose spacing is smaller than the wavelength of light used to measure the alignment. In a preferred embodiment, an alignment mark patterning process alters the appearance of the alignment mark and renders an enhanced contrast with the substrate background.

21 Claims, 15 Drawing Sheets

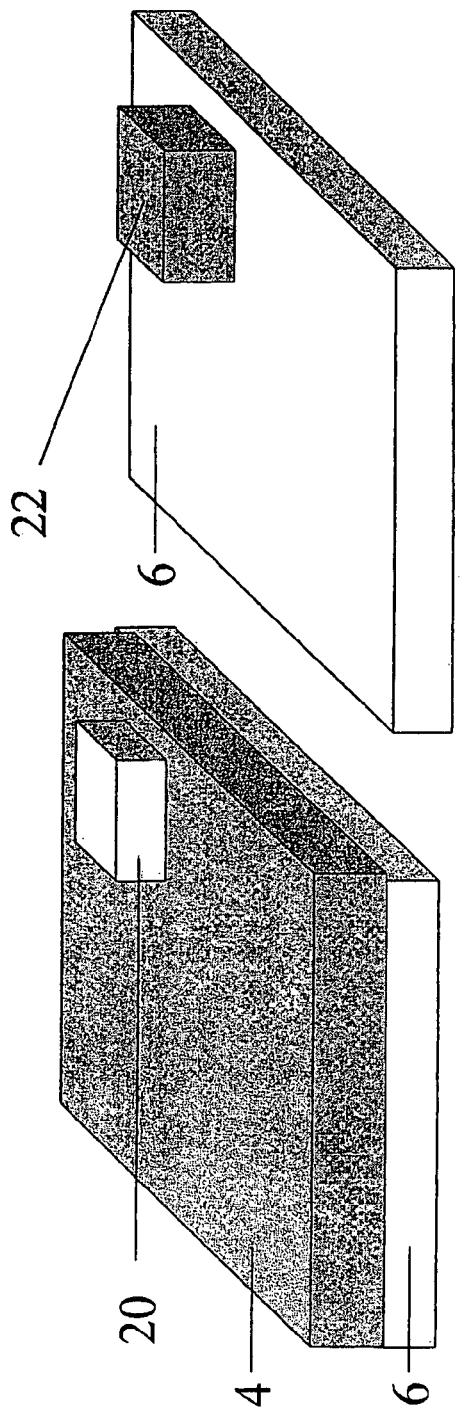
Figure 2(a)
PRIOR ART
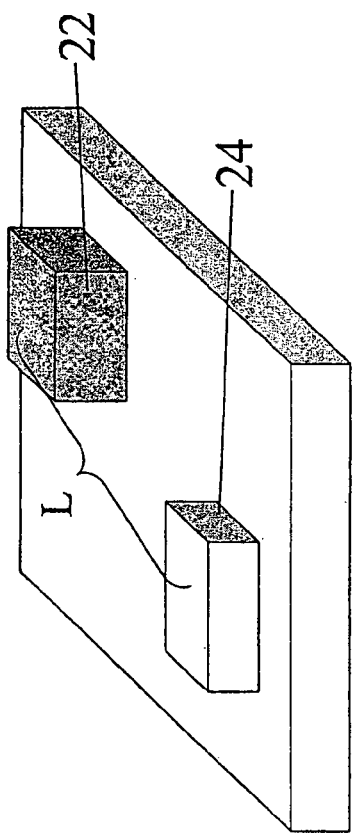
Figure 2(b)
PRIOR ART
Figure 2(c)
PRIOR ART

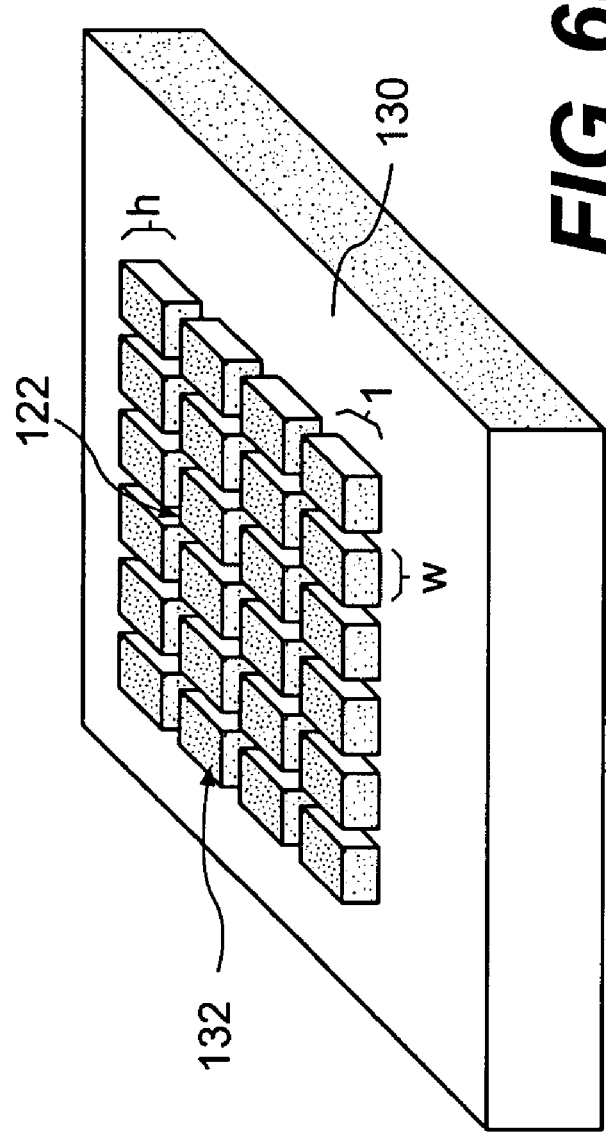
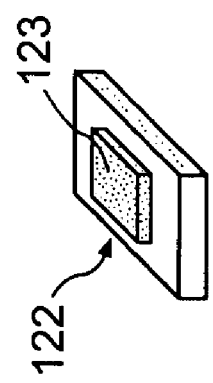
FIG. 6(a)
FIG. 6(b)

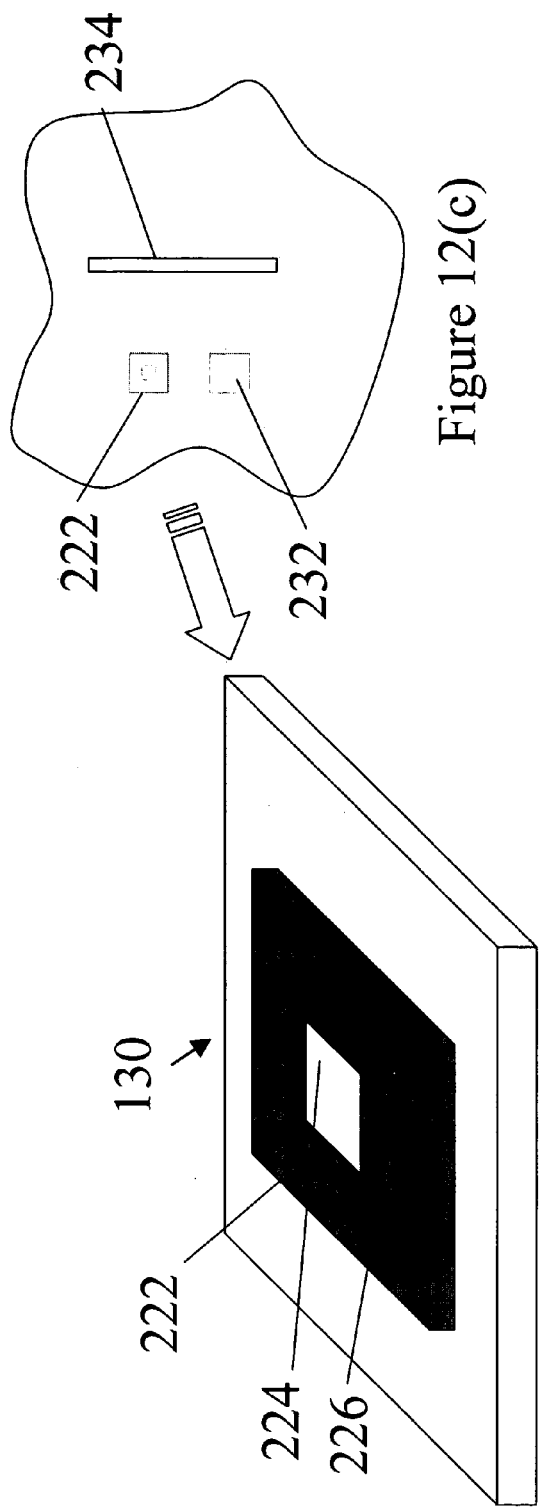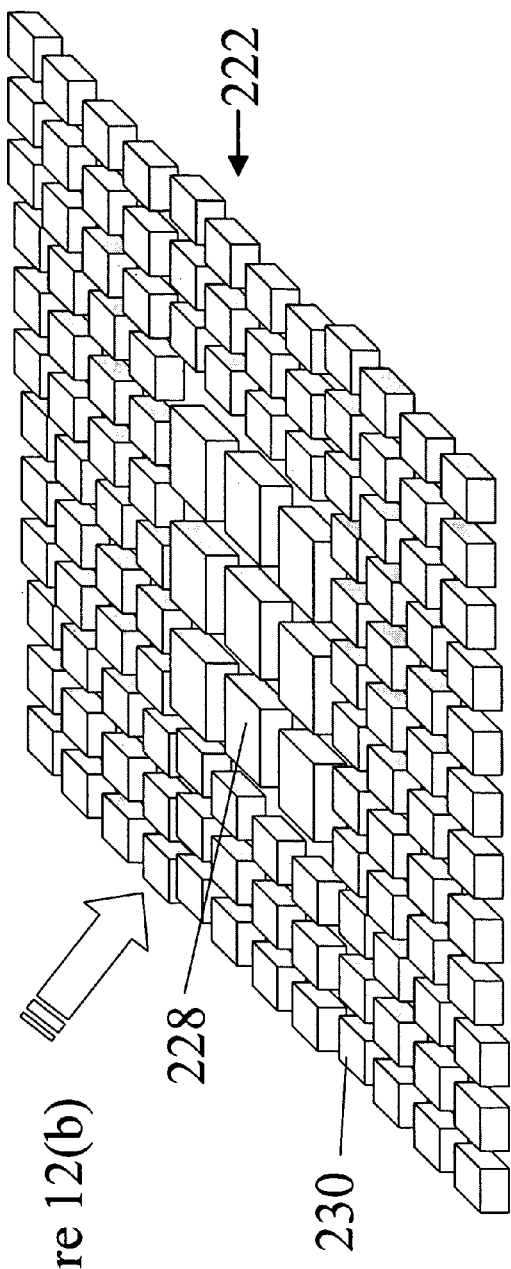
Figure 12(a)
Figure 12(b)
Figure 12(c)

MASK AND METHOD FOR USING THE MASK IN LITHOGRAPHIC PROCESSING

BACKGROUND

1. Field of the Invention

The present invention relates generally to lithographic methods and systems. More specifically it relates to methods to reduce overlay uncertainty by improving the imaging of patterned resist features.

2. Background of the Invention

The manufacture of products containing microscopic devices, such as memory chips, microprocessors, optical devices, micro-electromechanical devices (MEMS), and numerous other types of devices (hereinafter referred to as "chips"), typically requires lithographic patterning in which the microscopic features are in part defined by a photoresist ("resist") layer applied during chip processing. The resist layer is usually patterned by exposure to a radiation source, which selectively exposes microscopic areas of the resist by use of a patterned mask (in the case of optical or x-ray lithography) or a programmed exposure ("direct write") (in the case of electron beam lithography).

Once the resist is patterned, the resist pattern is transferred to permanent layers in the chip, creating features with similar size and shape to the resist features. In this manner, permanent features of the chip such as metal wires, insulating regions, or silicon structures are fabricated. Subsequent to permanent feature patterning, the remaining resist is typically removed. In many devices, up to about 20 different resist patterns (hereinafter termed "mask levels") may be employed to fully define all the patterns (hereinafter termed "mask levels") may be employed to fully define all the features of the device. Each mask level may pattern a different feature of a device or circuit. FIG. 1 shows a method for forming device features in two mask levels, well known to practicioners in the art. In FIG. 1(a), patterning with a first mask level results in the definition of resist feature 2, residing on top of silicon layer 4, which, in turn, is on top of oxide layer 6. In FIG. 1(b), the shape of resist feature 2 is transferred to the silicon layer, resulting in formation of element 8, e.g., a transistor gate. The transfer of the resist shape into the silicon layer may be accomplished by many techniques well known to skilled practicioners. FIG. 1(c) illustrates a top-down view after a second mask level is applied, resulting in the definition of resist mask 10, containing aperture 12, and residing on top of patterned transistor gate 8 and oxide 4 (not shown). In FIG. 1(d), metal wire 14 is formed in the region of aperture 12, with subsequent removal of mask 10. In this example, the shape of resist feature 12 is transferred to the metal wire 14 which contacts transistor gate 8.

In the above example, because, the placement of the transistor gate 8 is defined by a different mask level than that of the metal wire 14, it is critical that the mask level used for placing the metal wire is aligned with respect to the transistor level. For instance, width W of transistor element 8 may be less than 1 um, requiring that the placement of the metal line be somewhat more precisely defined in order to ensure that it overlaps the transistor to the appropriate extent. To accomplish this, the resist features in the second mask level must be aligned to the existing transistor structure already formed.

A ubiquitous problem in the prior art is the lack of precision in aligning the pattern of a given mask level to the underlying device features already present (referred to as overlay uncertainty). In prior art, many mask levels have features referred to as alignment marks (hereafter also referred to as "marks"), which can be used by a human or by an instrument to adjust the pattern placement of a given level. Typically, an alignment mark feature is not part of the actual working device, but is nevertheless transferred from resist into materials permanently incorporated in the device. Thus, resist feature 20 depicted in FIG. 2(a) is transferred into the silicon layer, creating alignment mark 22, as illustrated in FIG. 2(b). During a subsequent mask level patterning shown in FIG. 2(c), a resist alignment mark 24 is created, whose relative distance L from the silicon alignment mark 22 can be measured. Alignment marks may be significantly larger than many device elements and therefore are easier than the latter to image, providing a more convenient method of aligning device features formed in different mask levels, as opposed to measuring the distance between device elements directly. For instance, mark 24 typically might be several thousand nanometers (nm) in size, while resist feature 2 (FIG. 1) might be 100 nm in width, rendering it invisible to the unaided eye.

FIG. 3(a) illustrates this point further, where silicon transistor element 32 and silicon alignment mark 30 are fabricated with a desired spacing between them, using a first mask. After resist is applied for the next mask level, resist alignment mark 40 is formed by any of several well known lithographic processes. In addition, resist element 42 is formed to define the placement of an additional device feature, e.g., an oxide isolation mesa 44, near transistor element 32. FIG. 3(b) illustrates the device structure after mesa 44 formation, showing permanent oxide mark 40'. Referring again to FIG. 3(a), those skilled in the art understand that the spacing between transistor 32 and mark 30 is known, inasmuch as this is determined by the design of the mask used for their fabrication. Similarly, the relative positions of resist mark 40 and element 42 are determined by the mask design used to from the latter elements. Thus, measurement of the distance $L_2$ between silicon mark 30 and resist mark 40, provides a simple method to determine the separation of resist element 42 and transistor 32, which may be too small to measure directly. Were a serious misalignment to be detected, the patterned resist could be removed without harming structures 30 and 32. This would forestall incorrect placement of mesa 44 with respect to transistor 32, and afford the possibility of subsequently re-applying the resist element in order to achieve a better alignment of mesa 44 and transistor 32.

As is well known in the art, typical resists used to pattern chips are comprised at least in part of an organic polymer, which is transparent to the light used in equipment employed to measure alignment. When resist alignment marks are placed on reflective surfaces, e.g., metals, semiconductors, or certain insulators, light may be reflected back through the resist marks, reducing the ability to image the marks, especially at the mark edge. This renders it difficult to measure the relative alignment of different mask levels. Furthermore, as device feature sizes continue to shrink for many products such as memory and microprocessor chips, the tolerance for misalignment becomes much stricter. Referring again to FIG. 3(b), if it were critical that mesa 44 be within 2000 nanometers (nm) of transistor 32, an alignment error of 300 nm may be tolerable. However, if the separation required were only 250 nm, the 300 nm tolerance would clearly be unacceptable. In the latter case, a shift of 300 nm could easily result in formation of mesa 44 too far from transistor 32. Furthermore, using current resist processes, it may be difficult to image marks with sufficient resolution to ensure that a 250 nm difference in mark position can be accurately measured. Thus, in light of the foregoing it will be appreciated that there is a need to be able to more accurately measure the placement of alignment marks on devices during their processing.

SUMMARY OF THE INVENTION

The present invention relates to structures and processes that improve alignment measurement in products containing small features. In particular, a process and mask is disclosed that renders more precise measurement of resist alignment marks possible. An exemplary embodiment of the current invention comprises a resist mask containing at least one patterned resist alignment mark which appears darker than the substrate when observed under light used for examination of mark placement. This is accomplished in an exemplary embodiment of the current invention by use of a segmented patterning of the resist alignment mark, wherein the segmenting process comprises formation of a resist alignment mark from an array of isolated features (the state where no resist resides between features). The collection of features taken together define the overall mark shape and size (the formation of features within the resist alignment mark will also be referred to as "sub-patterning"). In an exemplary embodiment of the current invention, these features comprise an array of individual resist shapes, in which each resist shape is isolated from its neighbors. The length, width, height, and spacing of the shapes is such that the collection of shapes imparts contrast to the overall mark when placed on a substrate. In another embodiment, the resist marks comprise a continuous layer of resist across the entire mark, whose surface is deliberately roughened, such that the roughness pattern imparts surface features, whose length, width, height, and spacing impart contrast to the overall mark when placed on a substrate. In another embodiment, a process is disclosed for forming resist alignment marks with sub-patterning that imparts greater contrast to the overall mark than that of unpatterned marks when placed on a substrate and viewed under illumination.

BRIEF DESCRIPTION OF THE DRAWINGS

FIG. 2 is an illustration of an alignment mark process.

FIG. 6 is an illustration of features within an alignment mark according to an embodiment of the present invention.

FIGS. 12(a) to 12(c) illustrate details of an alignment mark according to still another alternative embodiment of the present invention

DETAILED DESCRIPTION OF THE INVENTION

Figure 1A:
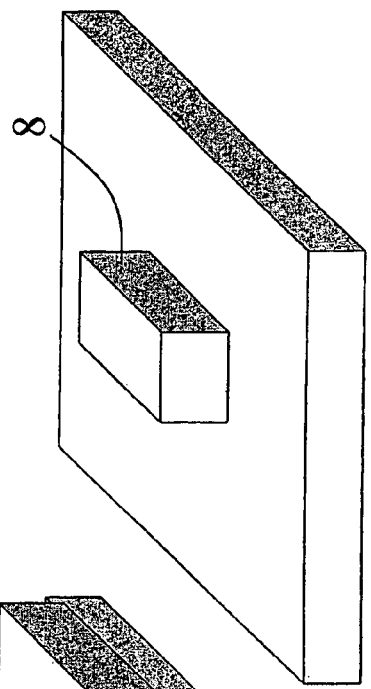
FIG. 1 is an illustration of alignment of features in two mask levels.
Figure 1B:
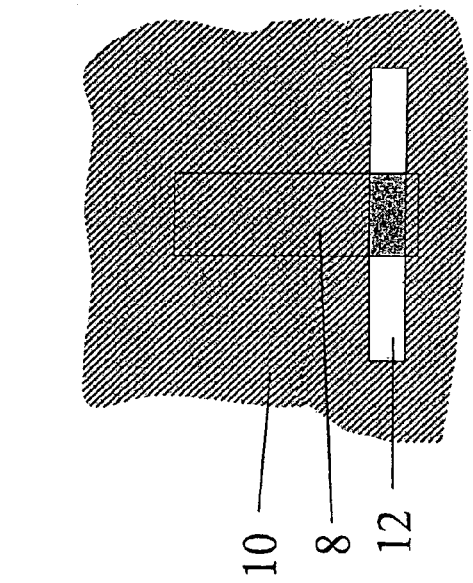
Figure 1D:
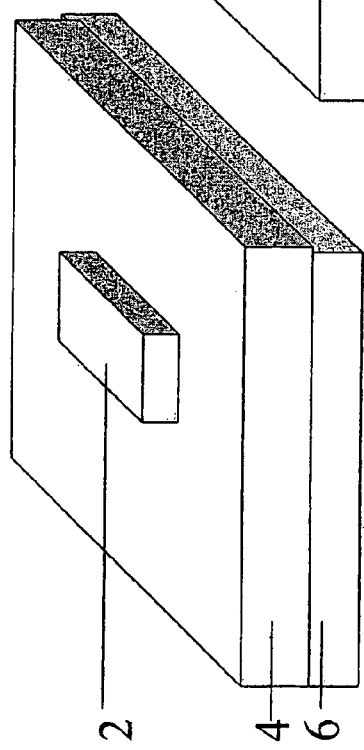
Figure 1C:
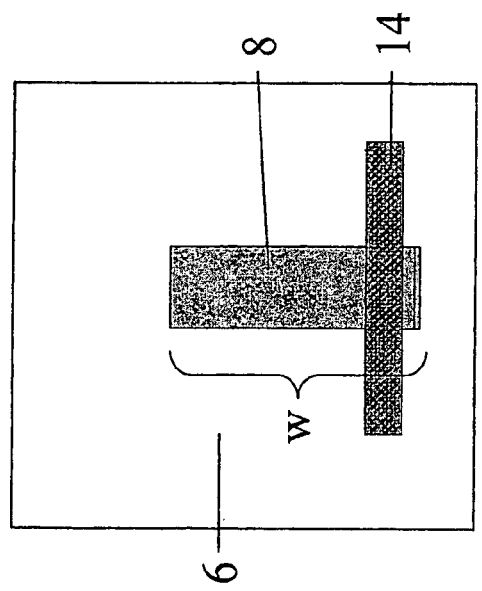
Figure 3A:
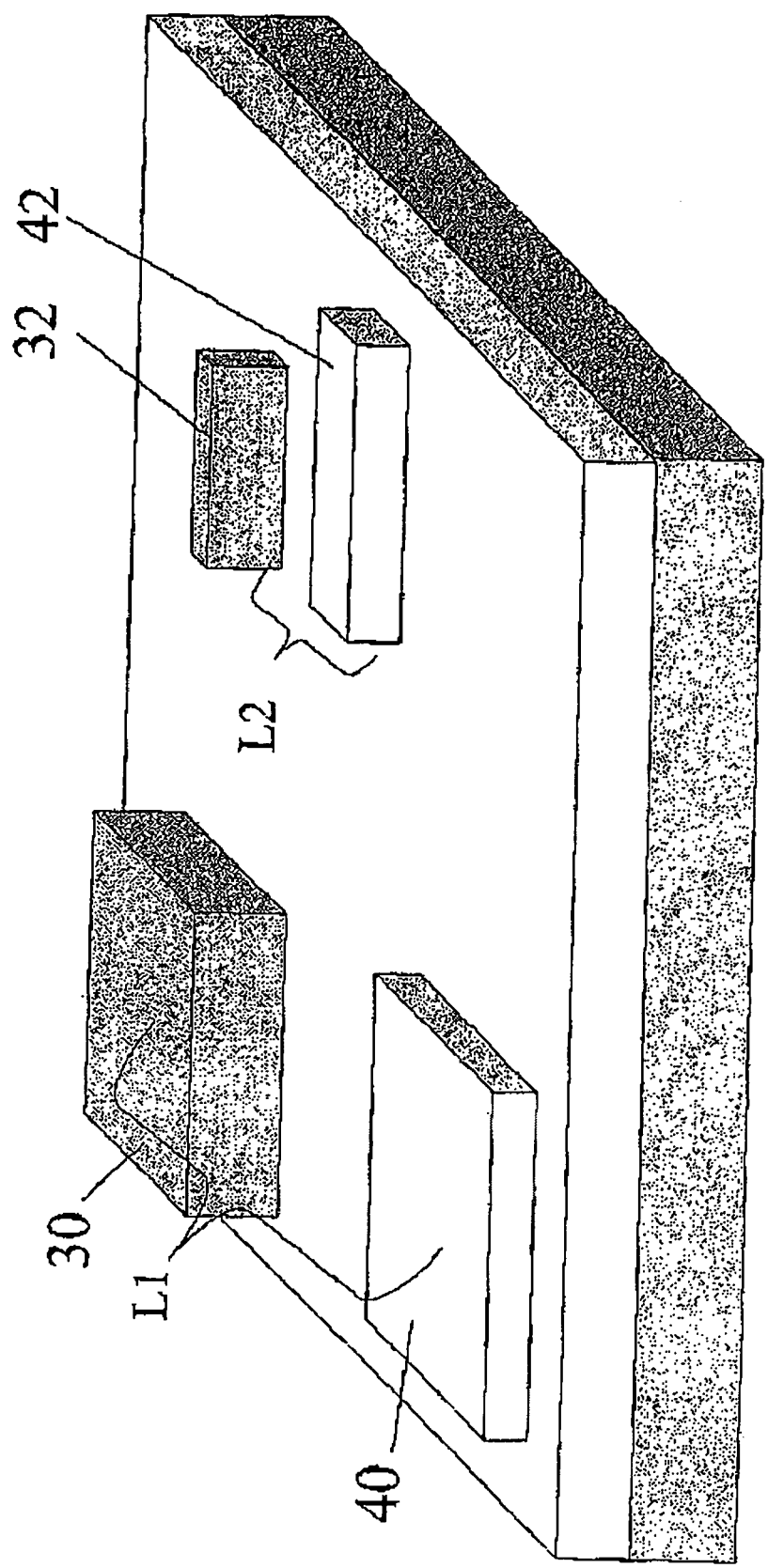
FIG. 3 illustrates the use of alignment marks to define device element positions.
Figure 3B:
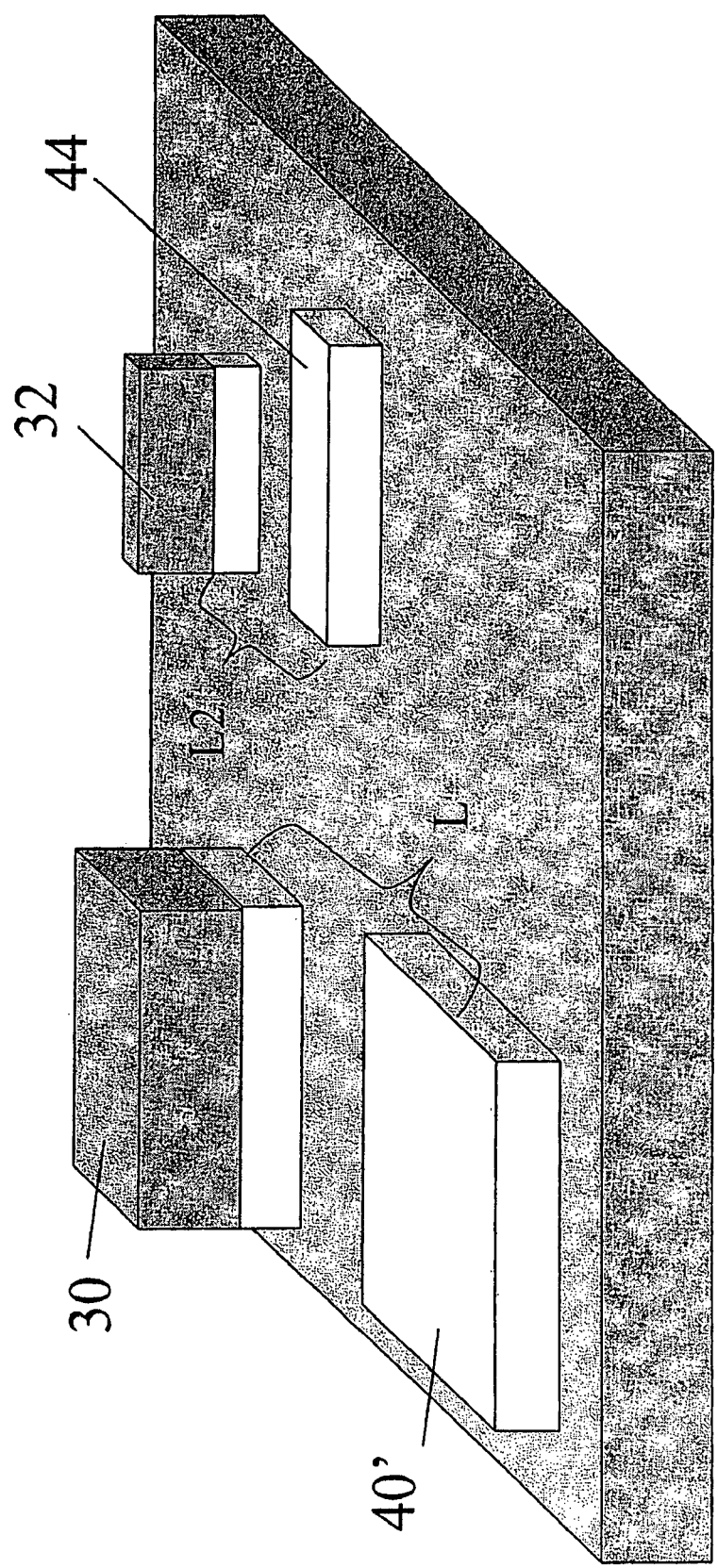

Before one or more embodiments of the invention are described in detail, one skilled in the art will appreciate that the invention is not limited in its application to the details of construction, the arrangements of components, or the arrangement of steps set forth in the following detailed description or illustrated in the drawings. The invention is capable of other embodiments and of being practiced or being carried out in various ways. Also, it is to be understood that the phraseology and terminology used herein is for the purpose of description and should not be regarded as limiting the scope of the invention.

Figure 4:
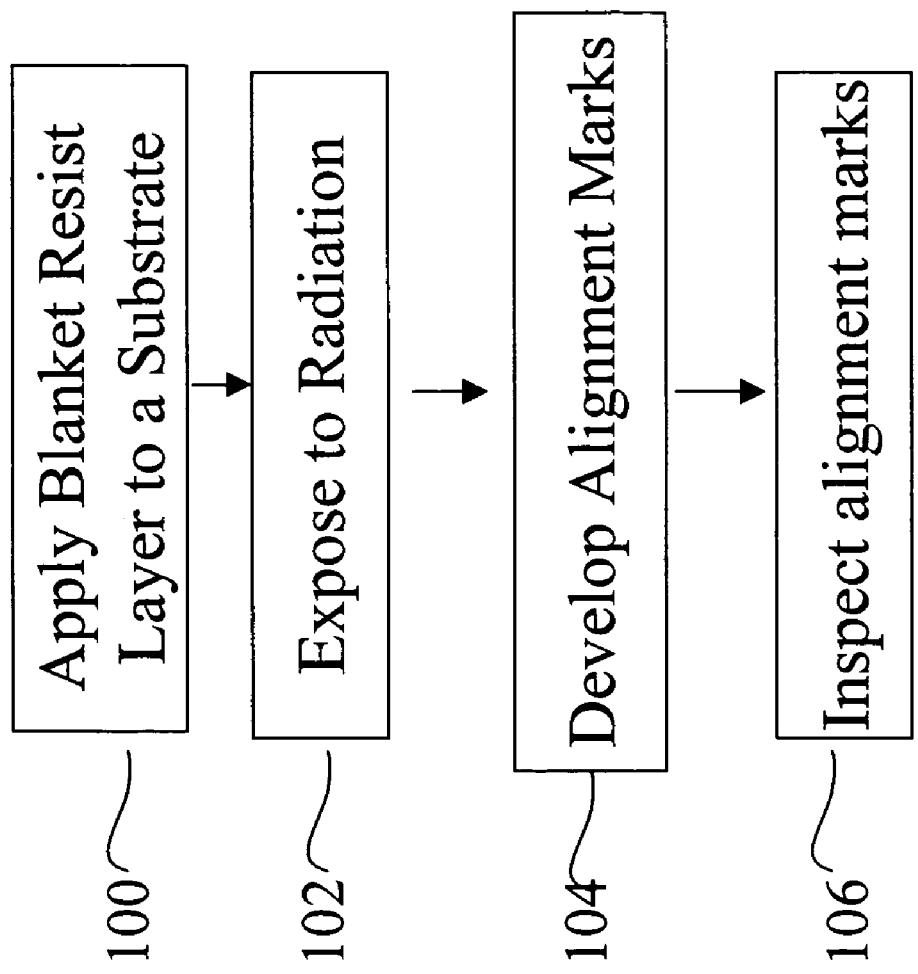
FIG. 4 illustrates process steps according to an embodiment of the present invention.

Preferred embodiments of the present invention include resist masks with sub-patterned alignment marks that are rendered more clearly visible by the method of formation of the marks. In light of the foregoing discussion, it will be appreciated that typical prior art alignment marks are formed in optically-transparent resist, which may render them difficult to measure, especially when placed on a reflective substrate. In a first embodiment, the sub-patterned alignment marks are formed by subjecting a blanket resist layer to a known sequence of lithography steps, as illustrated in FIG. 4. In step 100, a blanket resist layer is applied to a substrate. The substrate may be a silicon wafer, a semiconductor wafer, an optical material, a ceramic, a polymer, or any other material capable of being placed in lithography equipment. In a preferred embodiment, the substrate is a patterned silicon wafer. In step 102, a substrate containing a surface layer of resist is exposed to radiation to define the resist features, including alignment marks. It will be appreciated by those skilled in the art that the resist layer may comprise a positive or negative resist. In a preferred embodiment, the exposure step includes use of an optical stepper which exposes the wafer through an optical mask, patterned to produce the appropriate exposure pattern in the resist layer. It will be appreciated by skilled practitioners that exposure step 102 could be performed using a visible light source or ultraviolet light (UV) source such as a 248 nm or 193 nm excimer laser. Additionally, step 102 could be performed using proximity mask x-ray lithography or direct-write electron beam lithography. Both techniques are well known to practitioners in the art. At step 104, the resist is developed to produce the appropriate patterned features, including device structures and alignment marks.

Figure 5:
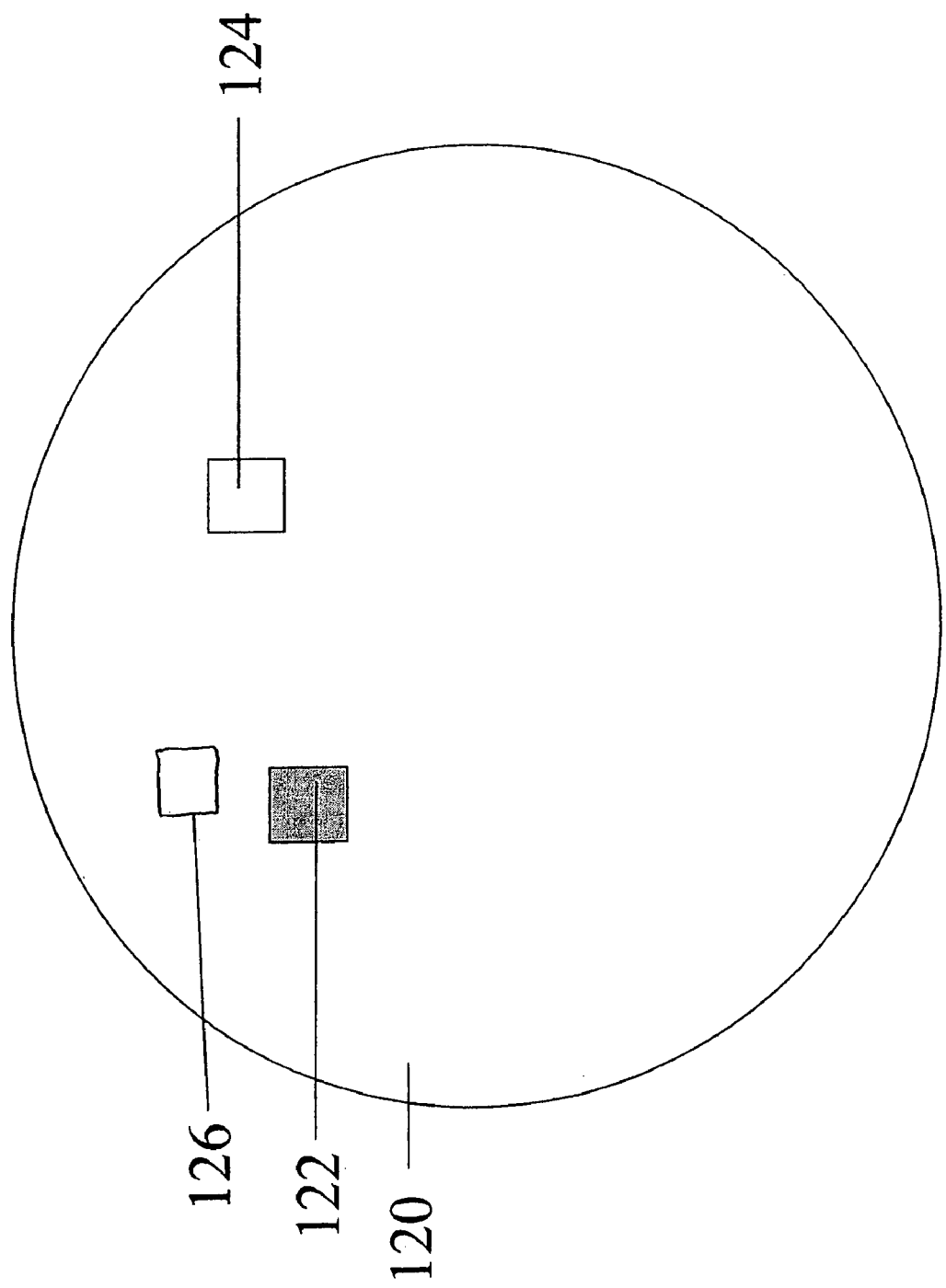
FIG. 5 is an illustration of the appearance of alignment marks.

After step 104, the substrate with patterned resist is inspected using an optical inspection instrument in step 106. This instrument is used to examine the alignment of the resist pattern with respect to the previously patterned structures. FIG. 5 illustrates the appearance of the patterned wafer containing resist features during optical inspection step 106. It is to be noted that the features are observed under a microscope at high magnification, for instance, 1000×. FIG. 5 illustrates a top down view of substrate 120 and alignment mark 122 formed according to an embodiment of the present invention. Also shown is prior art alignment mark 126. As illustrated in FIG. 5, resist alignment mark 122 appears more distinct than prior art mark 126, for reasons discussed below. Also shown is permanent mark 124, formed in a previous step and comprised of material such as silicon, oxide, or metal. Because of the good contrast provided, the measurement accuracy of the position of the center and edge of mark 122 is enhanced.

FIGS. 6(a) and 6(b) illustrate details of the structure for alignment mark 122, according to a preferred embodiment of the present invention. As shown in FIG. 6(a), alignment mark 122, residing on silicon layer 130, is comprised of an array (hereafter defined as a plurality of elements of similar size and shape, with a somewhat regular spacing of elements) of isolated features. Each resist feature 132 has a height h, which is less than or equal to the thickness of the unpatterned resist layer, and lateral dimension (hereafter defined as length (l) or width (w), or both length and width) less than about $\lambda/2$, where $\lambda$ is the wavelength of the light used to perform the alignment measurements. Preferably mark 122 has width and/or length greater than $\lambda$, e.g., greater than ~570 nm. In the example illustrated, the resist features are isolated from each other. Thus, in a preferred embodiment, mark 122 includes many resist features 132. FIG. 6(b) indicates that features 132 taken as a group impart an overall shape, size, and apparent border 123 to the mark 122 as it appears to the observer in an optical measurement instrument. In addition, features 132 help determine other aspects of the appearance of mark 122, e.g., the color, brightness, and sharpness.

Figure 7:
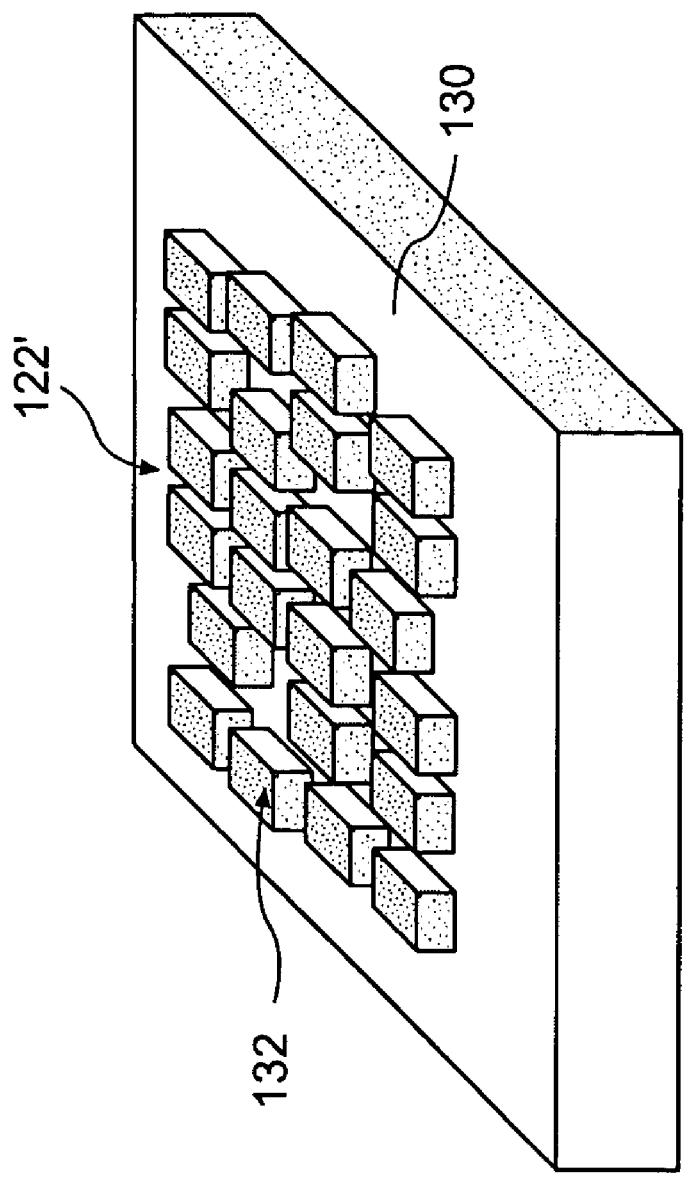
FIG. 7 is an illustration of features within an alignment mark according to another embodiment of the present invention.

FIG. 7 illustrates details of the structure for alignment mark 122, according to another embodiment of the present invention. In FIG. 7, the spacing between elements 132 is determined by a stochastic process; yet the average spacing is also less than about $\lambda/2$, as in the embodiment illustrated in FIG. 6.

If features 132 in an array are ordered with exact spacing D, where the value of D is on the order of $\lambda$, the wavelength of light used for alignment measurement, the array may act as a diffraction grating and reflect light in accordance with the Bragg equation:

$$\lambda\text{reflected} = 2D \sin\theta,$$

where $\theta$ is the angle of incidence of the light with respect to the substrate surface. Such a mark will appear highly reflective when viewed at angle $\theta$, while appearing less reflective when viewed at other angles. However, as is known to skilled practitioners, when D is less than $\lambda/(2 \sin\theta)$ diffraction will not take place. For example, if visible light illumination at ~570 nm is used for alignment measurement, then diffraction will not be visible for D<285 nm ($\lambda/2$), since $\sin\theta$ cannot exceed 1. In addition, as D is decreased below $\lambda/2$, the propagation and back reflection from substrate 120 of light incident on mark 122 decreases, due to the light scattering caused by features 132. This leads to a decreased brightness of mark 122, and increased contrast with respect to a bright substrate.

Figure 8:
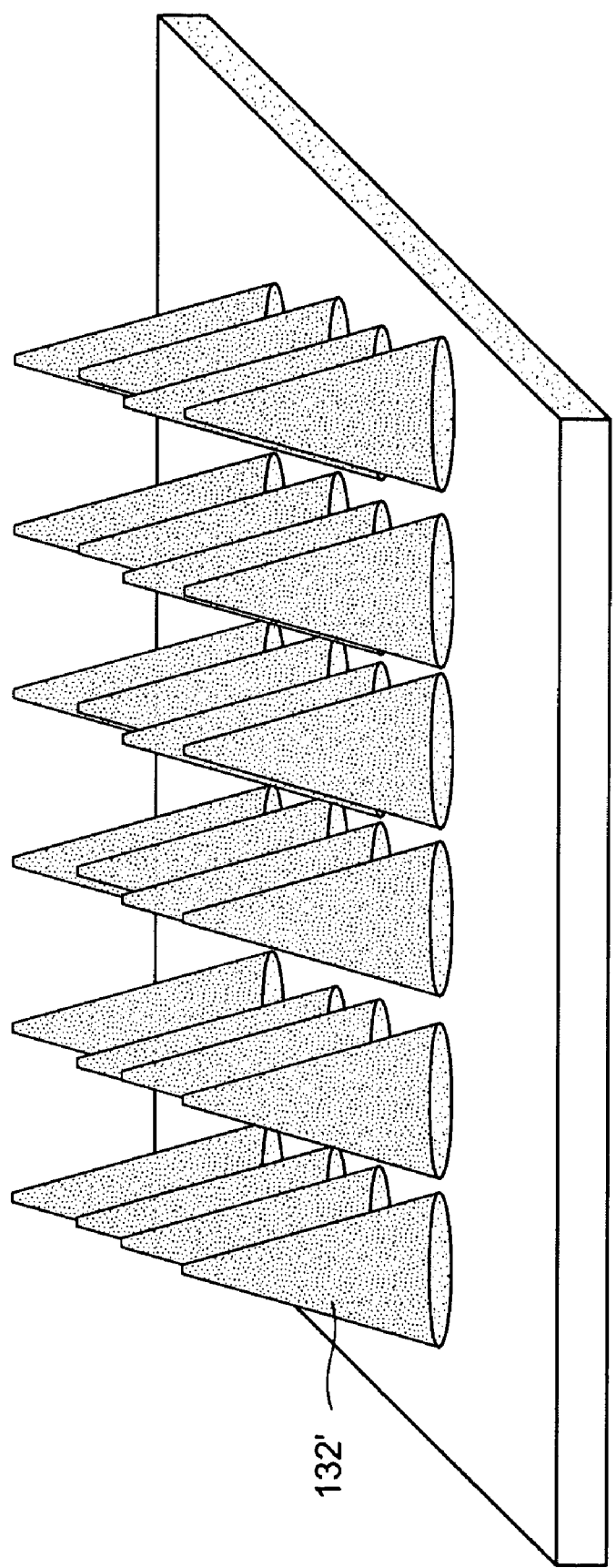
FIG. 8 illustrates details of alignment mark structure according to an alternative embodiment of the present invention.
Figure 9:
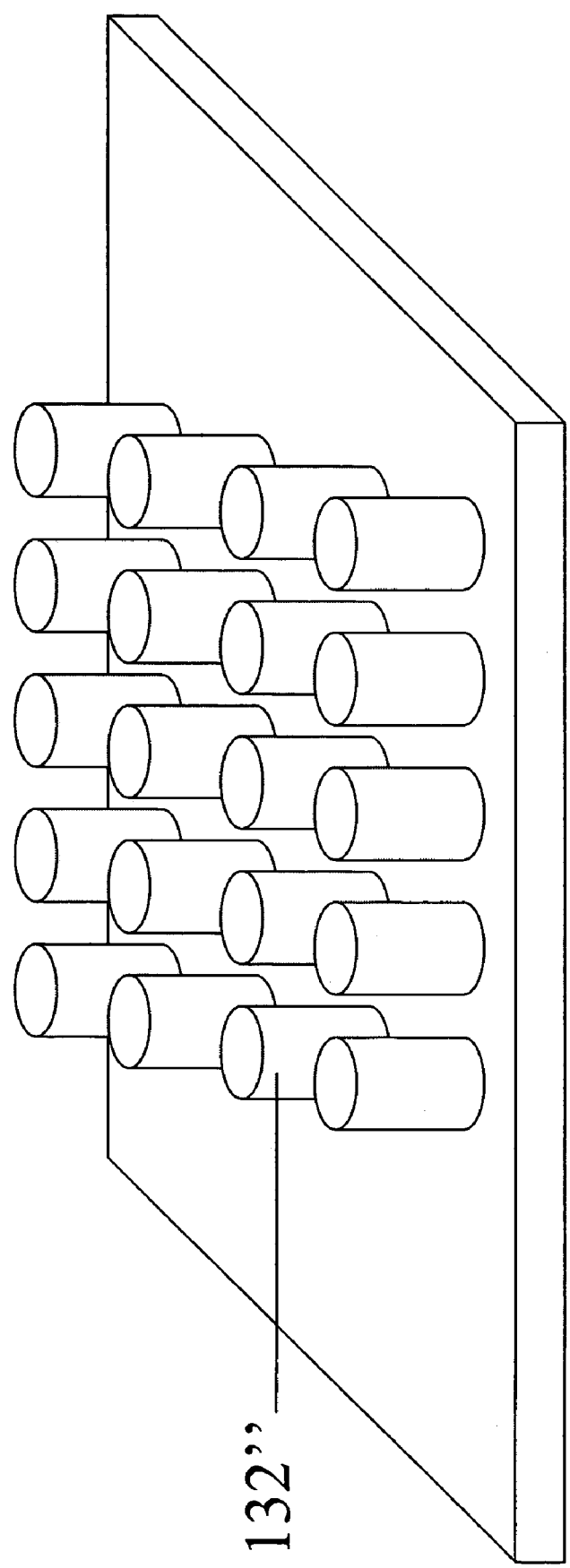
FIG. 9 illustrates details of alignment mark structure according to a further alternative embodiment of the present invention.
Figure 10A:
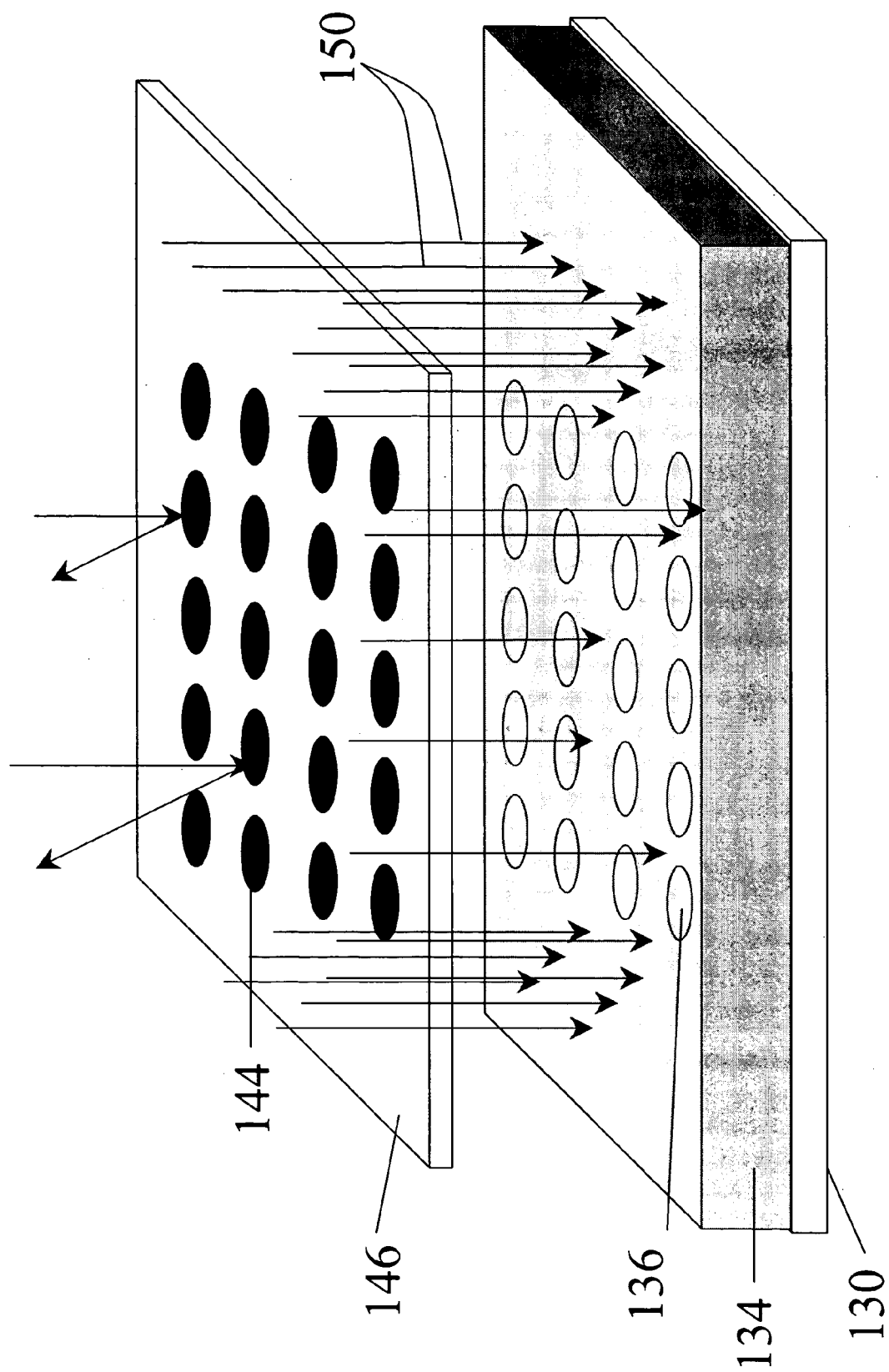
FIGS. 10(a) to 10(c) illustrate the process of alignment mark formation according to another alternative embodiment of the present invention.
Figure 10B:
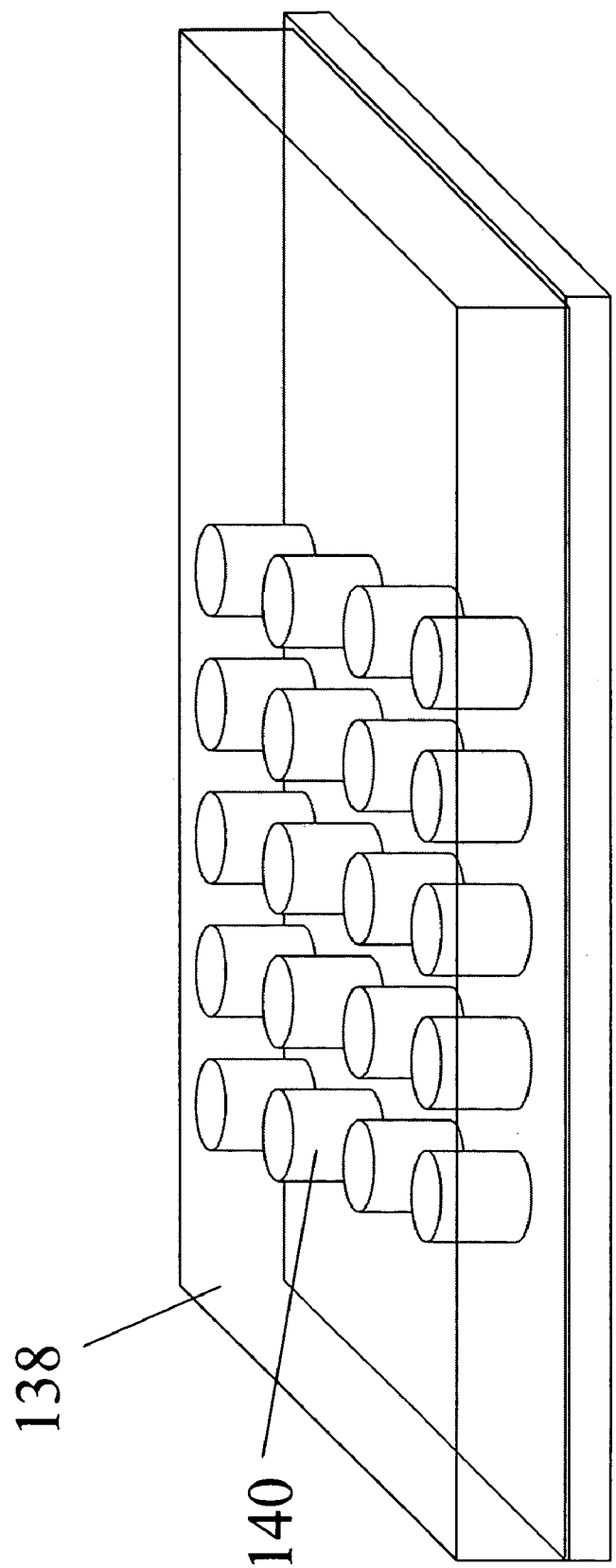
Figure 10C:
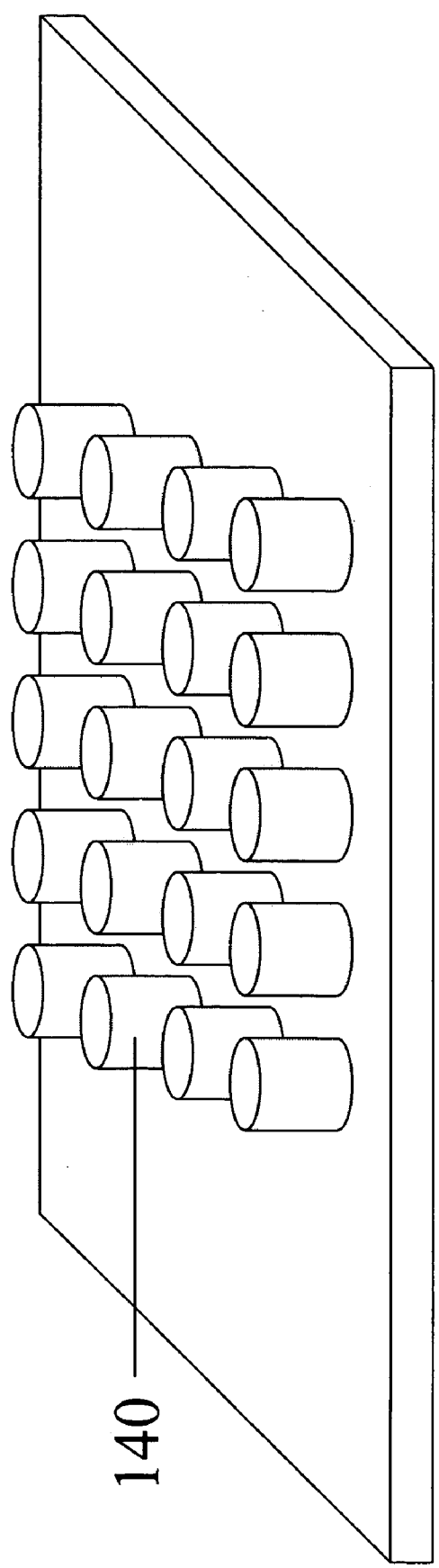

FIGS. 8 and 9 illustrate the cross-sectional appearance of features 132 according to alternative embodiments of the present invention. For example, the features may be conical (132') or cylindrical (132"), rectangular, hemispherical (not shown) or other shapes. It will be appreciated by skilled practicioners that these shapes can be obtained by choice of photomask shapes, exposure conditions during patterning, resist type, and development conditions. For instance, FIGS. 10(a) to 10(c) illustrate how cylindrical features 140 may be obtained using circular mask shapes 144. When resist layer 134 deposited on substrate 130 is exposed to radiation 150, shown in FIG. 10(a), all regions of layer 130 are irradiated except for circular regions 136, protected by circular mask elements 144, which block the radiation. Photomask elements 144 may be fabricated using one of a number of well known mask-generation procedures, including proximity correction, phase shift, and phase edge techniques. In FIG. 10(b) the exposed resist regions 138 are chemically altered, while unexposed cylindrical regions 140 remain unchanged. In FIG. 10(c) the altered resist regions have been removed by etching in an appropriate solvent which selectively attacks the altered resist, leaving the unaltered resist cylinders 140 intact.

Figure 11:
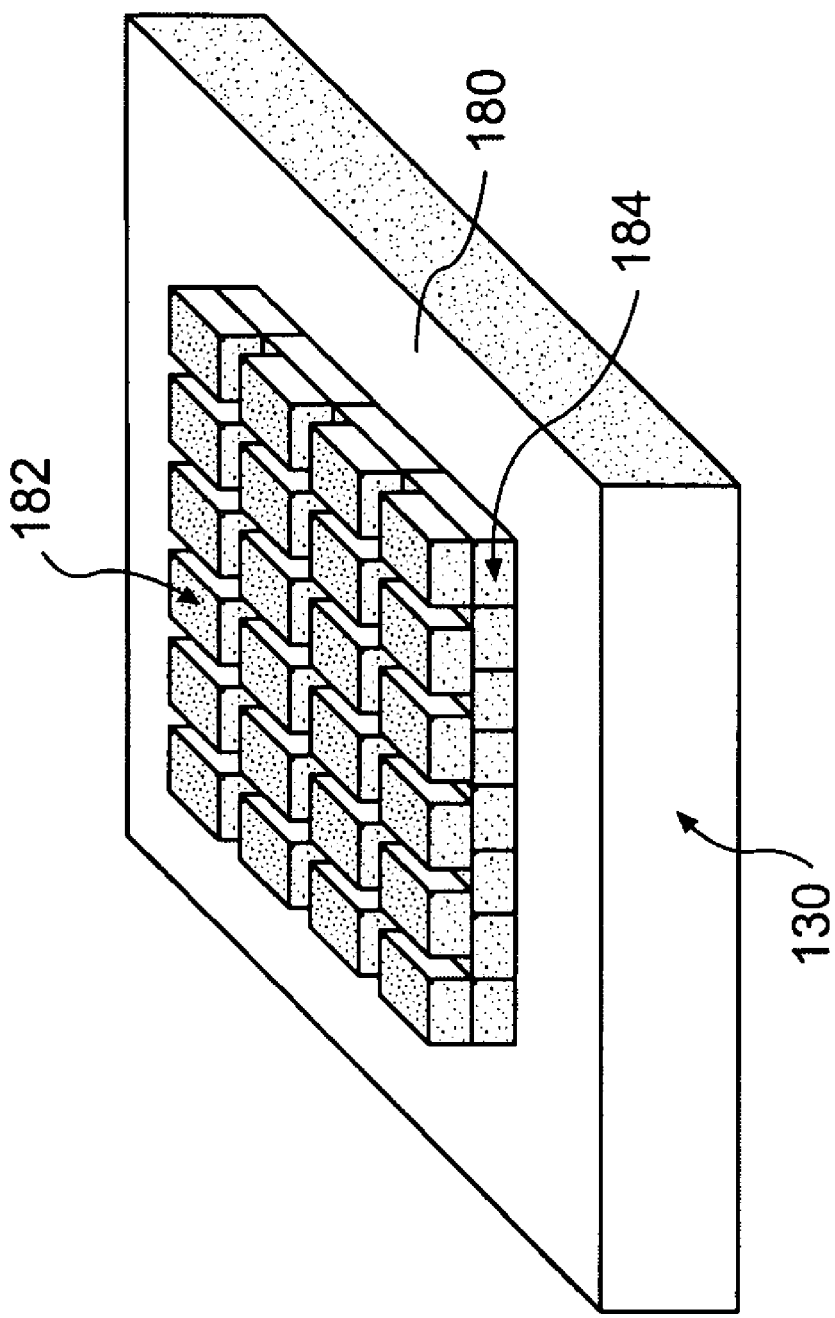
FIG. 11 illustrates details of an alignment mark according to a still further alternative embodiment of the present invention.

FIG. 11 illustrates a mark 180 according to an additional embodiment of the present invention. An array of patterned elements 182 resides on top of a continuous resist layer 184. By changing exposure conditions during lithographic patterning and resist thickness, the radiation can be attenuated so that layer 184 is not substantially altered, leaving it impervious to etching during a resist development stage. By careful tuning of the thickness of layer 184, the optical reflectivity of mark 180 can be altered.

In a further embodiment of the current invention, shown in FIGS. 12(a) to 12(c), mark 222 is comprised of regions 224 in the center region and 226 in the edge region, each region further including constituent features 228 and 230, respectively, as illustrated in FIG. 12(a). It is to be noted that the value of D for region 230 differs from that in region 228. For example, by fabricating features 230 with a smaller D value than that of features 228, a gradient in the brightness and reflectivity across mark 222 may be established. FIG. 12(b), which is a demagnified view of that shown in 12(a), indicates the appearance of distinct regions 224 and 226. FIG. 12(c) shows a further demagnified view of alignment mark 222 and uniform alignment mark 232. As indicated, the center of mark 222 is distinct, making it easier to measure the distance to feature 234. Another advantage accruing to such an arrangement is that visualization of the mark edge may be enhanced, facilitating better edge-to-edge measurements.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What we claim is:

1. A resist mask for measuring alignment on a substrate, the resist mask comprising at least one alignment mark, wherein the alignment mark includes patterned structures arranged as part of the resist mask and having a height that is less than the thickness of an unpatterned resist layer forming the resist mask, and wherein at least some of the pattern structures have a lateral spacing that is smaller than the wavelength of light used for alignment measurement.

2. The mask of claim 1, wherein the patterned structures further comprise a plurality of isolated resist features arranged to impart the desired size and shape of the alignment mark.

3. The mask of claim 2, wherein the patterned structures further comprise an array of features.

4. The mask of claim 2, wherein the patterned structures further comprise a stochastic assembly of features.

5. The mask of claim 2, wherein the patterned structures appear rectangular in cross-section and top view.

6. The mask of claim 1, wherein the lateral spacing of the patterned structures is less than about half the wavelength of light used for alignment measurement.

7. The mask of claim 1, wherein the at least one alignment mark further includes a continuous resist layer upon which the patterned structures are formed.

8. The mask of claim 7, wherein the patterned structures further comprise an array of features.

9. The mask of claim 7, wherein the patterned structures further comprise a stochastic assembly of features.

10. The mask of claim 8, wherein the patterned structures appear rectangular in cross-section and top view.

11. The mask of claim 7, wherein the lateral spacing of the patterned structures is less than about half the wavelength of light used for alignment measurement.

12. A resist mask for measuring alignment on a substrate, the resist mask comprising at least one alignment mark, wherein the alignment mark comprises at least two distinct regions, at least one distinct region formed from a plurality of patterned features arranged as part of the resist mask and having a height that is less than the thickness of an unpatterned resist layer forming the resist mask, and wherein at least some of whose lateral spacing is smaller than the wavelength of light used for alignment measurement.

13. The mask of claim 12, wherein each region of the at least two distinct regions includes a characteristic spacing between features, the characteristic spacing differing between regions.

14. The mask of claim 13, wherein the patterned structures further comprise a plurality of isolated resist features arranged to impart the desired size and shape of the at least two distinct regions within the alignment mark.

15. The mask of claim 13, wherein the mark comprises two concentric regions, the outer region comprising a smaller characteristic feature spacing than the inner region.

16. The mask of claim 14, wherein the mark comprises two concentric regions, the outer region comprising a smaller characteristic feature spacing than the inner region.

17. A resist mask for measuring alignment, the resist mask comprising at least one alignment mark, wherein the alignment mark includes patterned structures at least some of whose lateral spacing is smaller than the wavelength of light used for alignment measurement, and wherein the at least one alignment mark further includes a continuous resist layer upon which the patterned structures are formed.

18. The mask of claim 17, wherein the patterned structures further comprise an array of features.

19. The mask of claim 18, wherein the patterned structures appear rectangular in cross-section and top view.

20. The mask of claim 17, wherein the patterned structures further comprise an stochastic assembly of features.

21. The mask of claim 17, wherein the lateral spacing of the patterned structures is less than about half the wavelength of light used for alignment measurement.

* * * * *